United States Patent
Rajendran

(10) Patent No.: US 11,601,088 B2
(45) Date of Patent: Mar. 7, 2023

(54) METHOD, SYSTEM AND DEVICE PROVIDING ENHANCED QUALITY FACTOR RESONANT LC TANK IN AN INTEGRATED CIRCUITS

(71) Applicant: Steradian Semiconductors Private Limited, Bangalore (IN)

(72) Inventor: Gireesh Rajendran, Bangalore (IN)

( * ) Notice: Subject to any disclaimer, the term of this patent is extended or adjusted under 35 U.S.C. 154(b) by 22 days.

(21) Appl. No.: 17/013,559

(22) Filed: Sep. 5, 2020

(65) Prior Publication Data

US 2021/0399684 A1   Dec. 23, 2021

(30) Foreign Application Priority Data

Jun. 19, 2020  (IN) .............................. 202041025969

(51) Int. Cl.
| | | |
|---|---|---|
| *H03B 5/12* | (2006.01) | |
| *G01S 13/50* | (2006.01) | |
| *H03J 7/02* | (2006.01) | |
| *H03H 11/12* | (2006.01) | |
| *H03H 7/01* | (2006.01) | |
| *G01S 7/03* | (2006.01) | |
| *H03H 1/00* | (2006.01) | |

(52) U.S. Cl.
CPC ............. *H03B 5/1228* (2013.01); *G01S 7/032* (2013.01); *G01S 13/50* (2013.01); *H03B 5/12* (2013.01); *H03H 7/0115* (2013.01); *H03H 11/1291* (2013.01); *H03J 7/02* (2013.01); *H03H 2001/0078* (2013.01)

(58) Field of Classification Search
CPC .......... H03B 5/1228; H03B 5/12; G01S 13/50; H03H 11/1291; H03H 2001/0078; H03H 7/0115; H03J 7/02; H03J 3/20
USPC ............................... 331/167, 117 FE; 334/78
See application file for complete search history.

(56) References Cited

U.S. PATENT DOCUMENTS

| | | | |
|---|---|---|---|
| 8,018,312 B2 * | 9/2011 | Kossel | H03H 7/185 336/200 |
| 10,700,655 B2 * | 6/2020 | Medra | H03F 1/565 |

* cited by examiner

*Primary Examiner* — Arnold M Kinkead

(57) ABSTRACT

According to an aspect, a tank circuit in an integrated circuit comprising a plurality of metal strips forming a first part of a closed contour enclosing a first area, a set of split sections forming a second part and geometrically aligned with the closed contour, and a plurality of capacitors coupled between the split sections to form the tank circuit, wherein a first flux linkage due a current flowing in the set of split sections pass through the first area in the same direction as that of a second flux linkage due to the current flowing in the plurality of metal strips, and the set of split sections and the plurality of metal strips together forming an inductance coil.

7 Claims, 7 Drawing Sheets

METHOD, SYSTEM AND DEVICE PROVIDING ENHANCED QUALITY FACTOR RESONANT LC TANK IN AN INTEGRATED CIRCUITS

BACKGROUND

Cross References to Related Applications

This application claims priority from Indian patent application No.: 202041025969 filed on Jun. 19, 2020 which is incorporated herein in its entirety by reference

TECHNICAL FIELD

Embodiments of the present disclosure relate generally to electronic circuits more specifically to a method, system and device providing enhanced quality factor resonant LC tank in an integrated circuit.

RELATED ART

A tank circuit generally is referred to an electric circuit, consisting of an inductor represented by L and a capacitor represented as C that resonates at a desired frequency. The inductance value of the L and the capacitance value of the C determine the resonance frequency. The tank circuit is employed as a resonator, oscillator, filter, tuner and mixer, for example. The tank circuit is implemented as a device and/or as a part of a larger electronic system in an integrated circuit (electronic) chip as is well known in the art.

The performance of the tank circuit is often determined by the quality factor represented as Q. In that the quality factor is a measure of the ability/ratio of the circuit to store energy in a cycle to the energy dissipated and/or as the ratio of the resonant frequency to bandwidth as is well known in the art. Thus, a higher value of the Q represents good performance at least in terms of filtering, power dissipation etc.

In the integrated circuits operative at very high frequency say over and above 5 GHz, inductors are implemented using on-chip metal layers. At least in applications like multiple input and multiple output (MIMO) radar operative as object detector and 3D imaging, the quality factor of the tank circuit in general and implementation of the inductor in particular plays important role in the performance of the radar object detection.

SUMMARY

According to an aspect, a tank circuit in an integrated circuit comprising a plurality of metal strips forming a first part of a closed contour enclosing a first area, a set of split sections forming a second part and geometrically aligned with the closed contour, and a plurality of capacitors coupled between the split sections to form the tank circuit, wherein a first flux linkage due a current flowing in the set of split sections pass through the first area in the same direction as that of a second flux linkage due to the current flowing in the plurality of metal strips, and the set of split sections and the plurality of metal strips together forming an inductance coil.

According to another aspect, the tank circuit the closed contour is a polygon, the first area is area within the polygon and the set of split sections are aligned to one arm of the polygon and the plurality of metal strips forming the other arms of the polygon and the set of split sections are geometrically parallel to each other and direction of the current in each of the set of split sections are same. In that, the plurality of capacitor are coupled between the set of split sections such that, capacitors are parallel to each other.

According to yet another aspect, a local oscillator of a radar operative to detect an object through radio frequency (RF) signal is implemented with a tank circuit, the resonating tank circuit comprises a plurality of metal strips forming a first part of a polygon structure enclosing a first area, a set of split sections forming a second part and geometrically aligned with the polygon structure, wherein the set of split sections are geometrically parallel to each other and direction of the current in each of the set of split sections are same, and a plurality of capacitors coupled between the split sections to form the tank circuit, wherein a first flux linkage due a current flowing in the set of split sections pass through the first area in the same direction as that of a second flux linkage due to the current flowing in the plurality of metal strips, and the set of split sections and the plurality of metal strips together forming an inductance coil.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
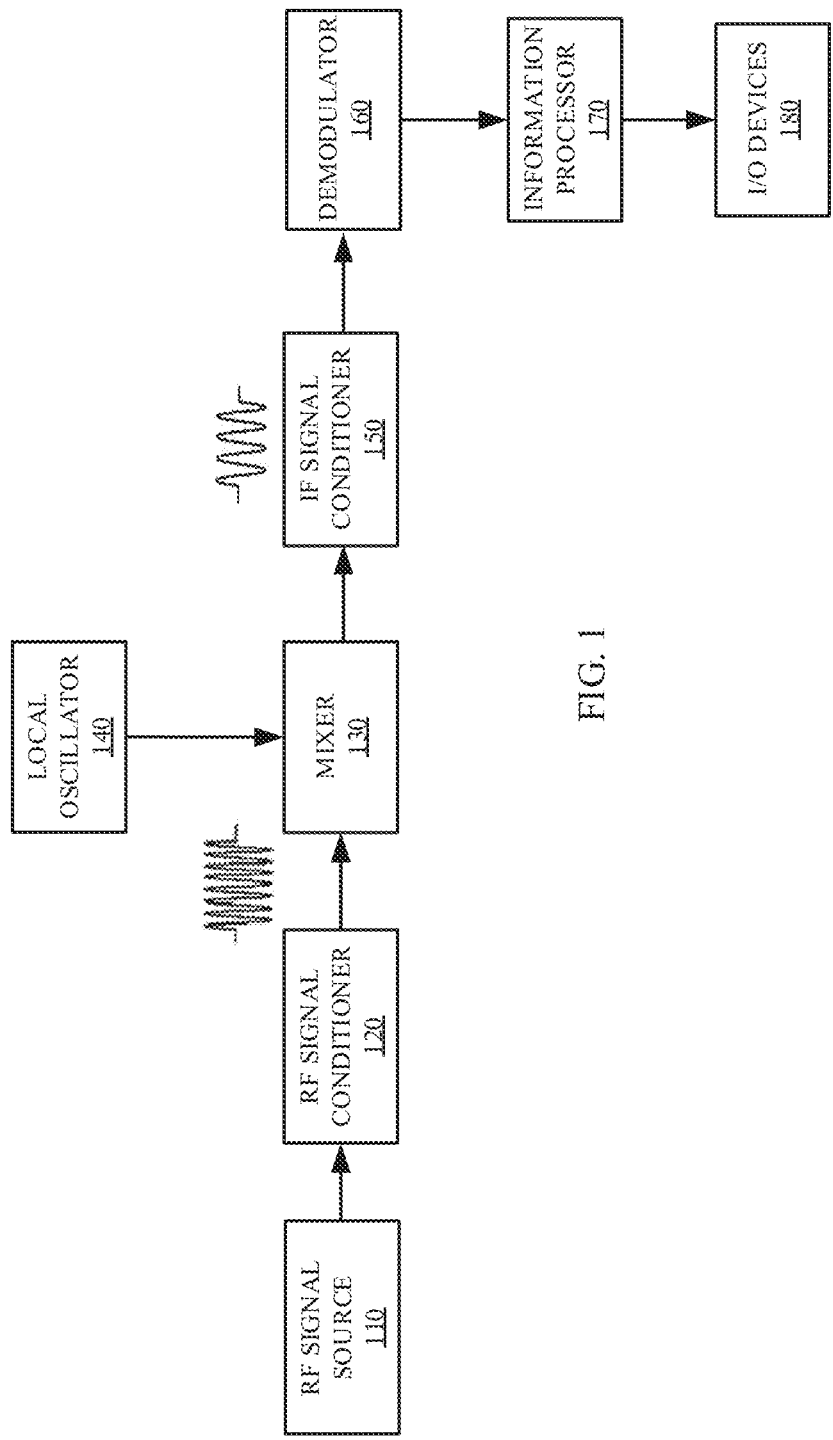
FIG. 1 is an example block diagram of a radar receiver system in which various aspect of the present disclosure may be seen.

FIG. 1 is an example block diagram of a radar receiver system in which various aspect of the present disclosure may be seen. As shown the example radar receiver system 101 may comprise, RF (Radio Frequency) signal source 110, RF signal conditioner block 120, Mixer 130, Local oscillator 140, an IF signal conditioner 150, Demodulator 160, Information processor 170 and I/O device 180. Each element of the radar receiver system is described in further detail below.

The RF signal source 110 represents the Radar signal received from the object (for example reflected signal) on one or more receiving antenna operating independently or in the MIMO configuration. The radar signal may comprise the signal separated in time and/or in frequency centered at a high frequency (carrier frequency) as is well known in the art. RF signal source 110 may comprise any other Radar signal adapted for different applications such as object detection, geo mapping, etc. The RF signal source 110 may also comprise any other signal transmitted by a communication system over a communication channel. The signal from the RF signal source 110 may be provided to RF signal conditioner 120.

The RF signal conditioner 120 conditions the RF signal for processing. The RF signal conditioner 120 may comprise at least one of a: low noise RF amplifier which provides initial gain and selectivity, RF frequency filter that may eliminate the noise, load balancing circuits etc. RF amplifiers may be implemented using a Bipolar and field effect transistors, or Integrated circuits (IC's), or similar kind. This block outputs desired frequency bands and these conditioned signal is provided to the mixer 130.

The mixer 130 receives the conditioned signal from the RF signal conditioner 120 and performs mixing operation with the reference signals. In one embodiment the mixer may be employed as part of the range detection, object detection etc. The Mixer 130 may provide output that may be the sum and/or difference frequencies of input signal and reference local oscillator signal. The mixer converts RF signal into IF (Intermediate Frequency) signal.

The local oscillator 140 provides a reference signal/frequency to the mixer 130 for mixing operation. In one embodiment the local oscillator excites a frequency for mixing with the incoming RF signal to get the intermediate frequency. The local oscillator 140 may provide one or more reference signal for mixing operation. The frequency of the reference signal (reference frequency) may comprise signal of Mega hertz and/or Gigahertz.

The IF signal conditioner 150 receives an IF signal from mixer 130 for processing. IF signal conditioner 150 may perform amplification, filtering and other signal conditioning operations. The filter operation may comprise eliminating frequency other than the ones that are centered at one or more IF frequencies.

The demodulator (or detector) 160 extracts information from the IF signal received from the IF signal conditioner. For example, operations of the demodulator may comprise, extraction of range information, azimuth and/or elevation angle of the object etc. The demodulator may also perform extraction of audio and/or video information from the IF signals. The demodulator 160 may be implemented in any known ways for extraction of the respective information.

The Information processor 170 receives the information from the demodulator and performs the one or more action on the information. For example, the range, azimuth and elevation angels received from the demodulator 160 are employed to construct 3d/2d object shape and position, terrain mapping etc. In an alternative embodiment, the information processor may perform image processing and audio processing to generate the video and audio for playing and storing, for example.

The I/O device 180 operates to provide interface such as display, speaker, navigation controller, and transceiver. Accordingly, the information processed by the information processor 170 is provided to the I/O device for control and display as may be the case. For example, the position, shape and range information may be provided to navigation control unit (not shown) to avoid collision in an unmanned vehicle navigation system.

In the radar receiver system 101, the RF signal conditioner 120, Mixer 130, Local oscillator 140, IF signal conditioner 150, for example, employ LC tank circuit for performing signal conditioning, filtering, generating reference frequency signal etc. The performance of the conventional LC tank circuit (generally measured by its Quality factor) may affect the performance of the receiver system at least in terms of accuracy in determining the range, Azimuth, elevation angle. Further, the performance of the conventional LC tank circuit in the Oscillator 140 may perturb the reference frequency of the Oscillator 140 thereby altering the IF frequency. Further, the performance of the conventional LC circuit may alter the performance of the low pas filters and band pass filters employed (not shown) in the RF signal conditioner 120 and IF signal conditioner 150. Also, the tank circuit may be implemented to provide high quality factor band-pass structures and to serve as the resonant element for oscillators and load network for band-pass RF amplifiers.

In one embodiment, the radar receiver system 101 employs LC tank circuit providing enhanced quality factor in integrated circuits to at least overcome some of the disadvantages noted with the conventional LC tank circuit. The manner in which the LC tank circuit may be implemented to provide the enhanced Q in an integrated circuit is further described below.

Figure 2:
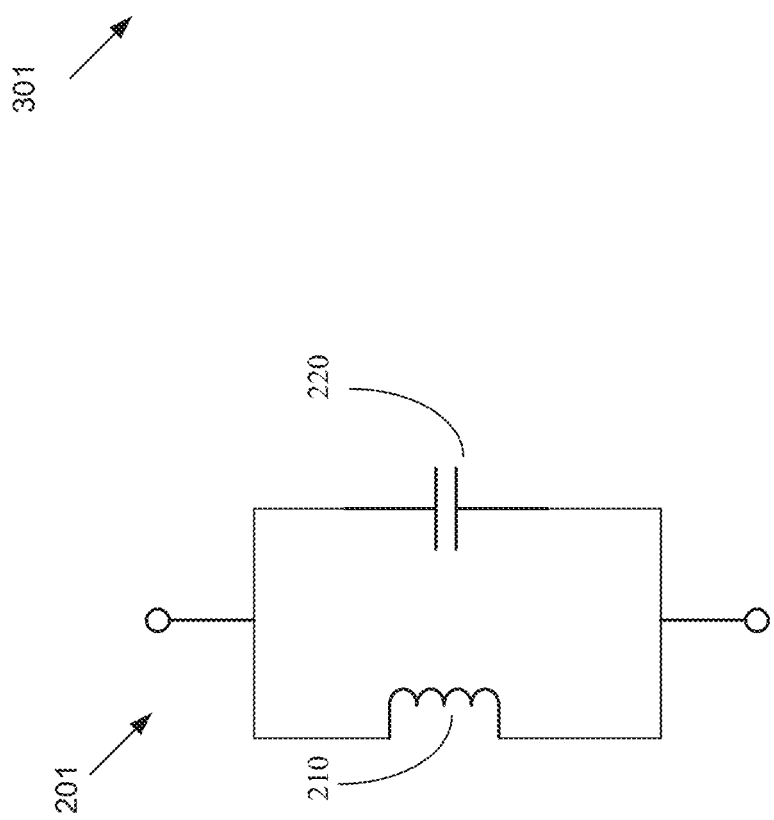
FIG. 2 is an example tank circuit in an embodiment.

FIG. 2 is an example tank circuit in an embodiment. The tank circuit 201 is shown comprising an inductor (L) 210 and a capacitor (C) 220 connected in parallel. The energy exchange between inductor 210 and capacitor 220 produces oscillations in the circuit. The Tank circuit 201 is employed in the radar receiver system 101 as described in the sections above. The tank circuit performance is measured by its quality factor Q at the resonance frequency, given by $$Q = \frac{1}{R}\sqrt{\frac{L}{C}}$$

Wherein R is a resistance, L is inductance and C is the capacitance of the tank circuit. The quality factor Q is directly proportional to inductance L. Variation in tank circuit elements may cause variation in quality factor. The inductance L may be implemented within an integrated circuit on one or more metal layers in the form of a metal coil.

Figure 3:
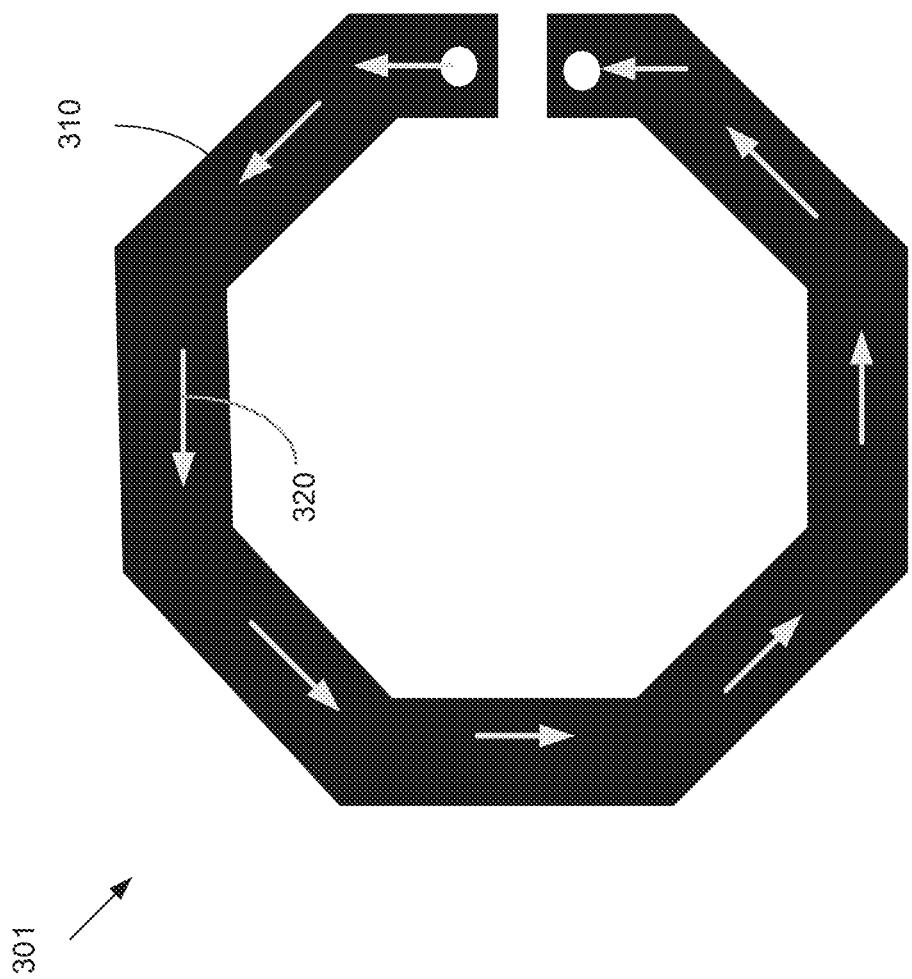
FIG. 3 depicts an example part of a conventional inductor structure 301 in an integrated circuit.

FIG. 3 depicts an example part of a conventional inductor structure 301 in an integrated circuit. The circular (closed contour) metal strip 310 is implemented on metal layers of the integrated circuit. The circular metal strip 310 (substantially circular) is designed to provides an inductance of a value L determined by relation (1) L=(μA)/l In that, "A" representing the area formed by the circular coil 310, "l" is the length of the circular coil and μ is the permeability. As is well known, the inductance is also represented as L=Φ/i. In that, Φ representing the flux linked within the area A and "i" is the current flowing in the circular coil 310. Thus, the inductance value L follows the relation (1) when the flux due to the current flowing in the circular coil 310 is engaged in full by the circular coil 310. Further, the part of the inductance 310 is shown with the current 320 flowing in the same direction (anti clock wise) throughout the part of the inductor 310. Thus, ideally providing an inductance of value L as per the relation (1). However, inductor part 310 required to be coupled to one or more capacitor 220 on the integrated circuit to form the tank circuit 201.

Figure 4:
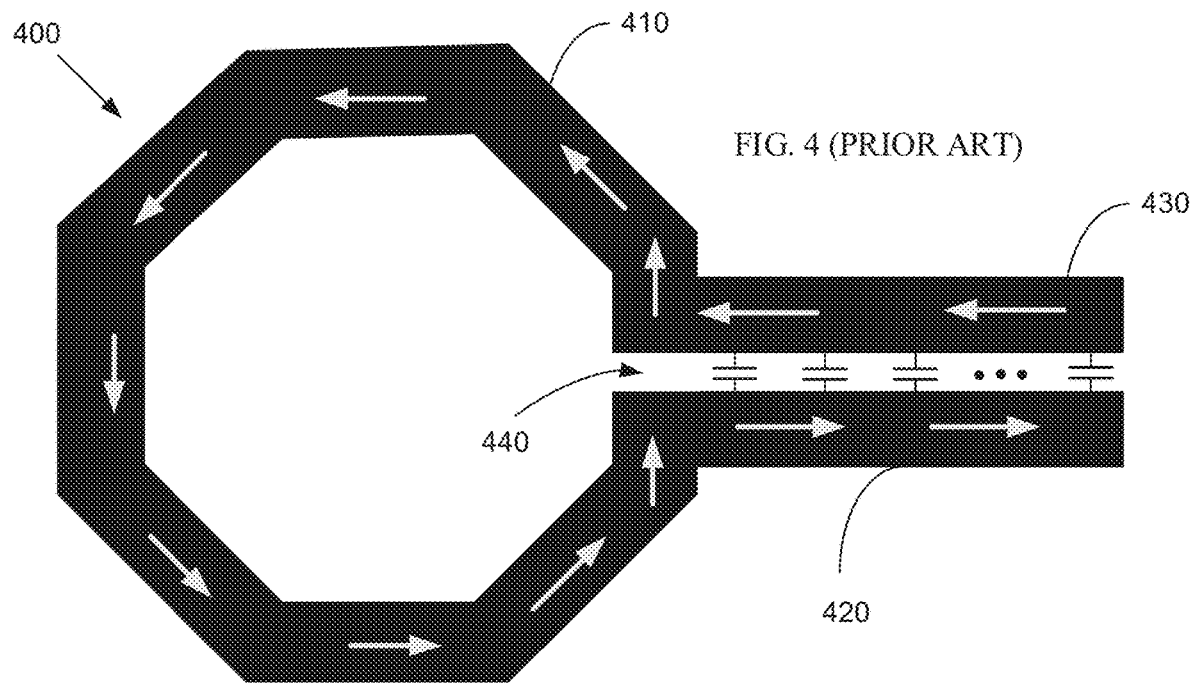
FIG. 4 depicts an example conventional tank circuit in which inductor part is coupled to the capacitor in an integrated circuit.

FIG. 4 depicts an example conventional tank circuit in which inductor part is coupled to the capacitor in an integrated circuit. The conventional tank circuit 401 is shown comprising the routing extension arms 420 and 430. A set of capacitors 440 are coupled between the routing extension arms 420 and 430. The current flowing through the extension arm 420 and the current flowing through the extension arm 430 are equal in magnitude but opposite in direction. The extension arms 420 and 430 are formed on one or more metal layers and coupled to the inductor part 410 (same as 310). Thus, the inductor part 410, extension arms 420 and 430, and the capacitor 440 together form the conventional tank circuit in the integrated circuit.

It may be seen that, the current flowing the extension arms 420 and 430 are not contributing to the flux linkage in the inductor part 410. Thus, the two extension arms 420 and 430, due to having flux of equal in magnitude and opposite in direction may introduce additional inductance that will have lower inductance per unit length due to flux cancellation and similar loss/resistance per unit length as 410. Thus the extension will be contributing an inductance with lower quality factor compared to 410.

Figure 5:
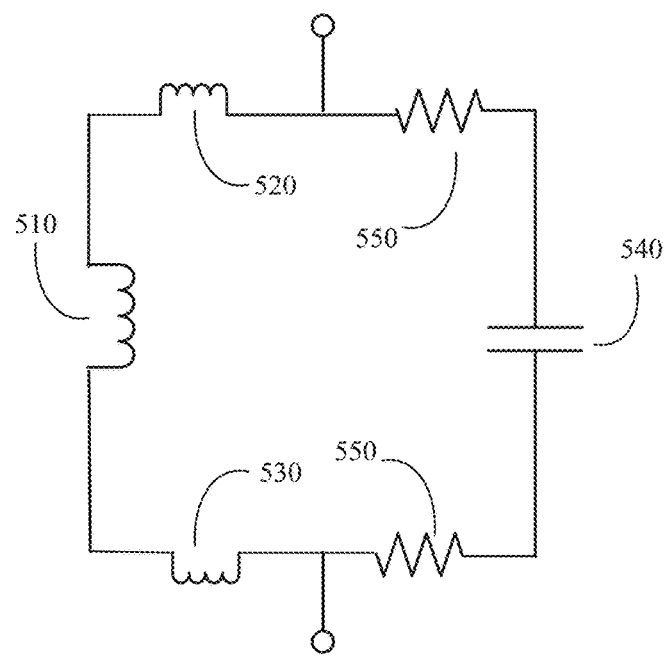
FIG. 5 depicts the example effective tank circuit resulting from conventional tank circuit implementation in the integrated circuit.

FIG. 5 depicts the example effective tank circuit resulting from conventional tank circuit implementation in the integrated circuit. In that, 510 corresponds to the inductor from part 410, part 520 and 530 corresponds to inductance due to arms 420 and 430, part 540 corresponds to capacitor set 440 and the part 550 corresponds to resistance added by the arms 420 and 430. Thus, apparently, the conventional implementation introduces undesirable circuit elements to the tank circuit reducing the quality factor and/or other parameter determining the performance.

Figure 6:
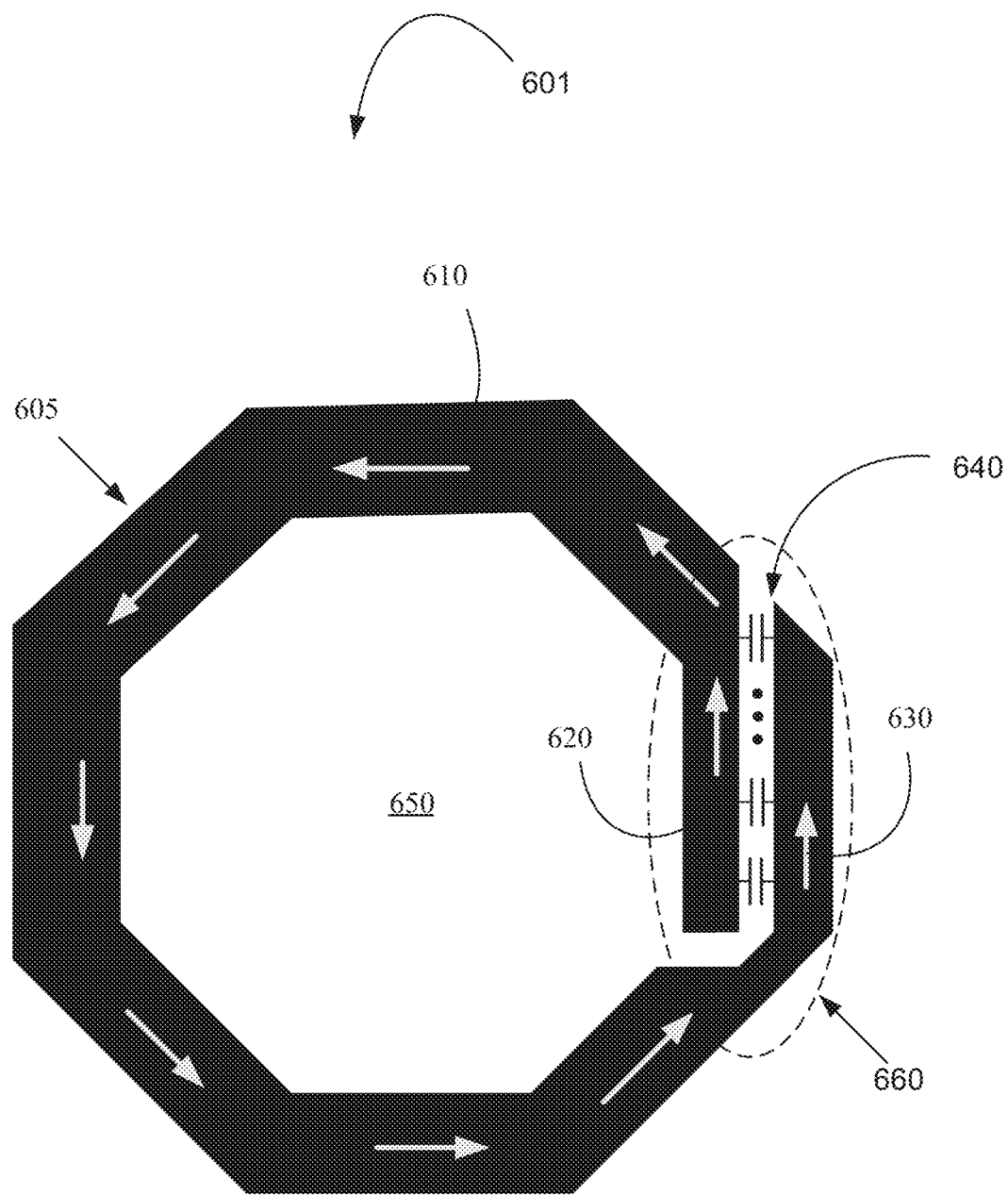
FIG. 6 is an example tank circuit/device in one embodiment.

FIG. 6 is an example tank circuit/device in one embodiment. The example tank circuit 601 is shown comprising plurality of metal strips 610, split sections 620 and 630, and set of capacitor 640. The elements of the example tank circuit are further described below.

The pluralities of metal strips 610 are shown making a part of closed contour (polygon). The closed contour forming the enclosed area 650. The plurality of metal strips 610 and the split sections 620 and 630 may be fabricated on one or more metal layers forming the enclosed area 650. The number of sides of the polygon may be selected to provide circularity to the coil. In this particular case, eight segments (octagonal structure) are shown for illustration. Number of strips (segments of the polygon) may be increased or decreased as may be the case to form the closed area 650. A few segments may be formed on one metal surface/layer and another set of segments may be formed on another metal layer maintaining the area 650 (when viewed across the layers either as top view or bottom view, for example). Segments may be electrically coupled through vertical vias (conductive holes through the metal layers) when implemented over multiple layers. Any known fabrication technique may be adopted to form the circular coil structure 610. The term circular thus refers to the formation of a coil with metal strips of linear segments, smooth curves, arcs circular paths, etc., Accordingly, the circular coil structure 605 is shown comprising the pluralities of metal strips 610 and split sections 620 and 630. Further, the set of capacitors 640 are coupled to the inductor 605 through the split sections 620 and 630 to form the tank circuit 601 (equivalent to 201). In one embodiment, the split sections 620 and 630 are geometrically aligned to form one of the segments of the polygon the closed area 650. In an alternative embodiment the split sections may be formed on multiple metal layers while maintaining the closed area 650. In one embodiment, the direction of the current in the split sections 620 and 630 are maintained to follow the direction of current in the circular strip 610 (for example, anti clockwise as sown). Thus, a continuous routing region 660 is created within the inductor 605, along the direction of current flow for connecting capacitors 640 and other elements. The current flow and flux in this routing region aids the inductance and reduces the degradation in quality factor while connecting the capacitors and other elements.

It may be further appreciated that, the sum of the current on section 620 and 630 at any point of the corresponding geometrical circular part remain same (or substantially same) as that of a current flowing in the other segments of the circular strip 610. For example, the current entering the segment 630 reduces as it flows upwards in the segment 630 due to parallel connections of the capacitors 640. Accordingly, current in the segment 620 increases as moved upwards in the segment 620 as the current received from capacitors adds as geometrically moved up through the segment 620. In other words, the total current on the split sections is same as the current flowing in the other arms of the polygon thereby, the split sections operating together as a one of the arm of the polygon.

Due to the geometrical alignment and the current flow alignment as shown, the flux produced by the split sections 620 and 630 also maintain the linkage (fall within the area 650) with the coil 605. Further, in an alternative embodiment the thickness or width of each split section 620 and 630 may be adjusted to provide effective width of the other segment. For example, the width of each section 620 and 630 may be set to half of the width of the other segment. In yet another embodiment, the thickness of the strip 620 and 630 may be set to 40% of the thickness of the other segments.

Further, it may also be appreciated that, as one of the segments of the polygon are employed to couple the capacitor 640, the additional strips are avoided thereby reducing various undesirable effects noted with respect to the conventional coupling. In other words, due to the continuous routing of current within the inductor structure there may be at least 10% improvement in quality factor Q compared to conventional inductor 401 structures with extended routing for a 250 pH inductance in typical CMOS process. Further, since the routing is a part of inductance, silicon area required to implement the tank circuit is reduced for a given LC value.

Figure 7:
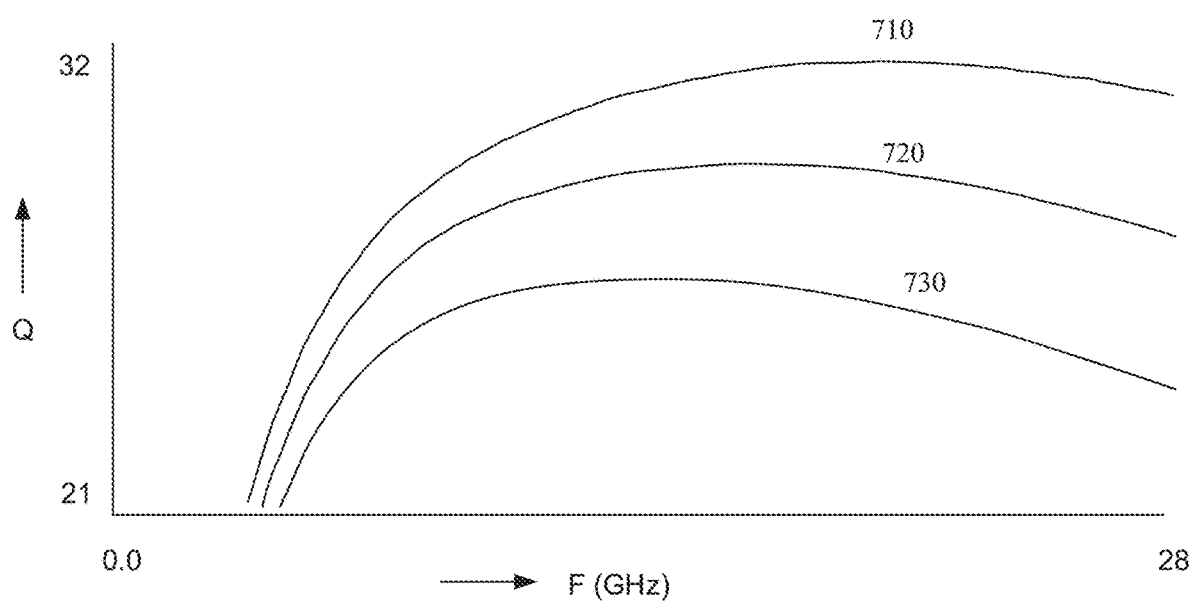
FIG. 7 is a graph illustrating quality factor versus frequency variations for different tank circuit/inductor structures.

FIG. 7 is a graph illustrating quality factor versus frequency variations for different tank circuit/inductor structures. The horizontal axis reads frequency in GHz and vertical axis reads the quality factor Q. The curve 710 shows variation in quality factor Q of inductor structure without any routing extension (structure 201 considered without routing and ideal case as example). The curve 720 shows performance measure of quality factor of inductor structure having routing region within the inductor (605) in an embodiment. The curve 730 shows quality factor Q measure for an applied frequency of conventional inductor structure (401) with routing arms. The graph shows an improvement in quality factor Q in the embodiments of the present disclosure compared to the conventional extended arm routing.

In one embodiment, the tank circuit 601 is employed within the radar receiver 101 for enhanced object detection accuracy. For example, the tank circuit 601 may be implemented at least in the part of the RF signal conditioner block 120, Mixer 130, Local oscillator 140, an IF signal conditioner 150, Demodulator 160 for respective operations, thereby enhancing the overall performance of the radar receiver. The tank circuit 601 may be implemented to provide high quality factor band-pass structures. Also, to serve as the resonant element for oscillators and load network for band-pass RF amplifiers. High quality factor ensures better noise performance for the oscillators and better power consumption and filtering for band-pass RF amplifiers. Even conventional components like inductor in CMOS IC has achieved high quality factor (near 30 at 15 GHz), however with the introduction of dedicated thick metal layers, the final quality factor degrades by more than 15% due to the associated routings. Thus, the inductor 601 and the routing there in 660 enhances the overall quality factor in an integrated circuit.

Figure 8A:
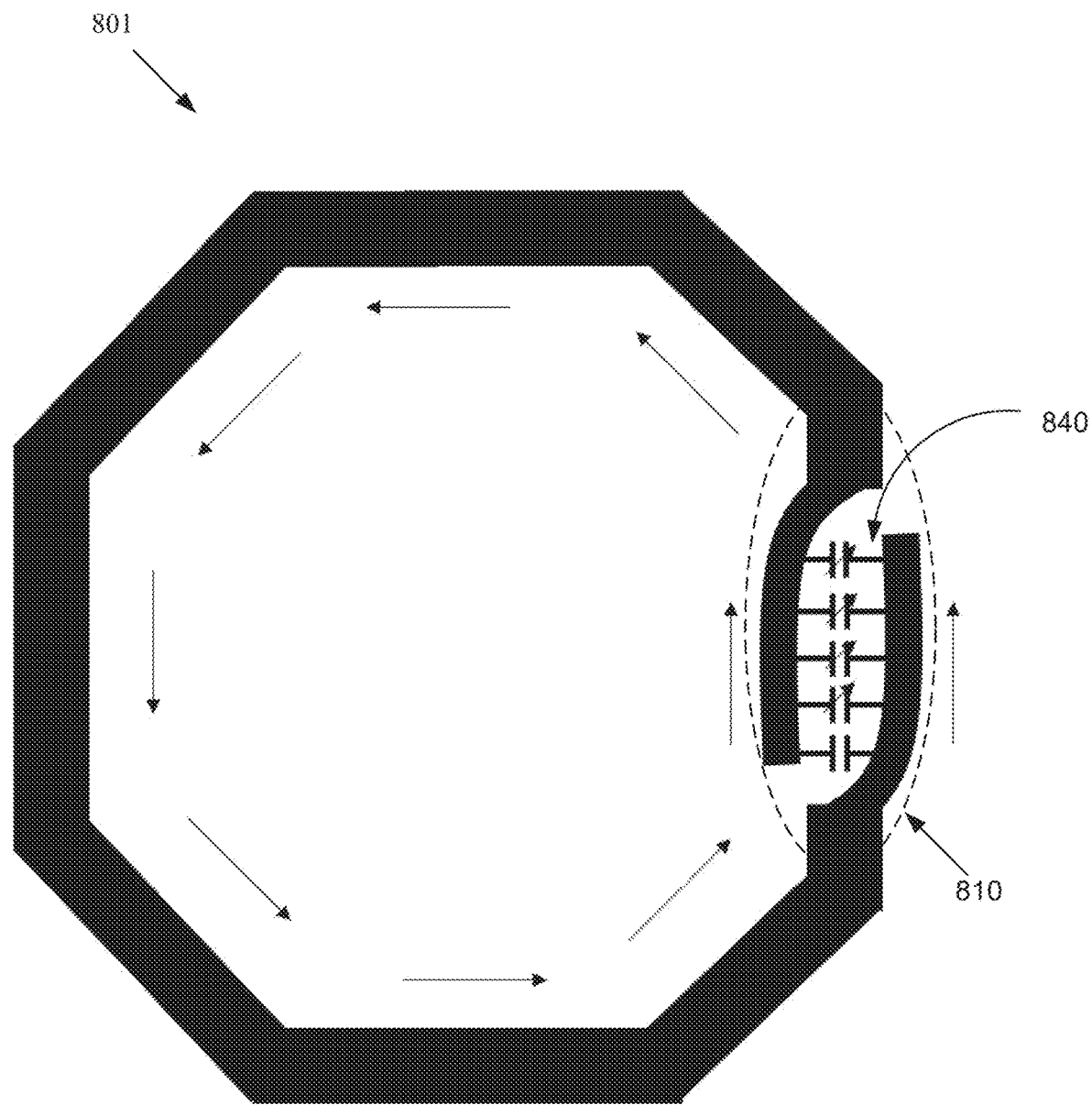
FIG. 8A and FIG. 8B are an alternative embodiments in which a continuous routing region 660 is implemented differently.
Figure 8B:
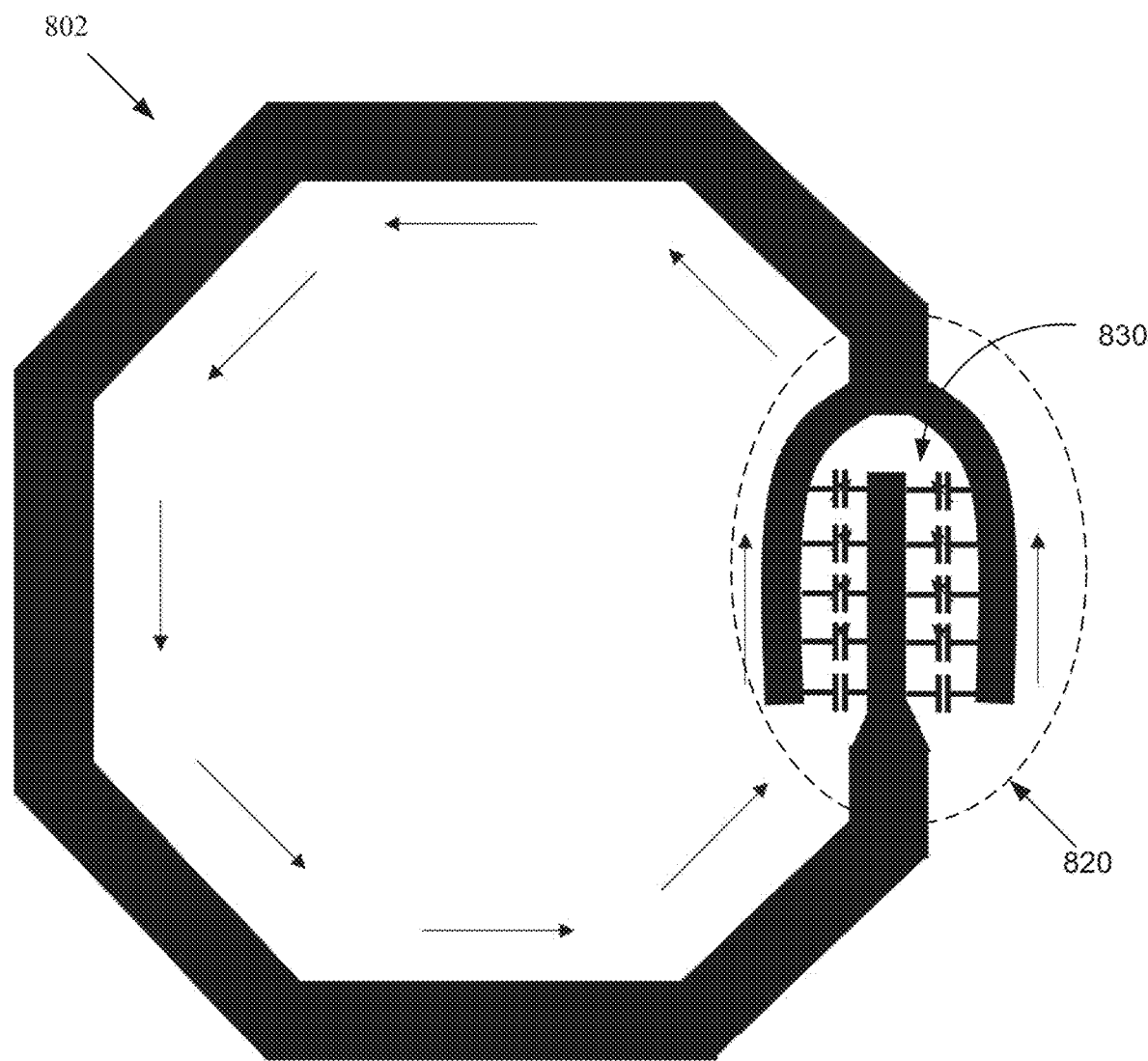

FIG. 8A and FIG. 8B are an alternative embodiments in which a continuous routing region 660 is implemented differently considering the fabrication procedure and/or capacitor size, for example. Procedures such as etching/masking and number of capacitors being connected to the tank circuits are considered for implementing the continuous routing region 810 and 820. For example, when the capacitor is larger in value (with large number of capacitive elements 830) the routing region 820 may be implemented as FIG. 8B. Similarly, a wider gap (larger silicon area) is provided in the routing region 810 for implementing the large size capacitor 840.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A tank circuit in an integrated circuit comprising:
    a plurality of metal strips forming a first part of a closed contour enclosing a first area;
    a set of split sections forming a second part and geometrically aligned with the closed contour, wherein the plurality of metal strips and the set of split sections are formed on one metal layer of the integrated circuit comprising plurality of metal layers and the set of split sections and the plurality of metal strips together forming an inductance coil; and
    a plurality of capacitors coupled between the split sections to form the tank circuit,
    wherein a first flux linkage due a current flowing in the set of split sections pass through the first area in the same direction as that of a second flux linkage due to the current flowing in the plurality of metal strips.

2. The tank circuit in an integrated circuit of claim 1, wherein the closed contour is a polygon, the first area is area within the polygon and the set of split sections are aligned to one arm of the polygon and the plurality of metal strips forming the other arms of the polygon.

3. The tank circuit in an integrated circuit of claim 2, wherein the set of split sections are geometrically parallel to each other and direction of the current in each of the set of split sections are same.

4. The tank circuit in an integrated circuit of claim 3, wherein the plurality of capacitor are coupled between the set of split sections such that, capacitors are parallel to each other.

5. The tank circuit in an integrated circuit of claim 4, wherein the set of split sections provide a continuous routing region for coupling the plurality of capacitor.

6. The tank circuit in an integrated circuit of claim 2, wherein the inductance of the coil is proportional to the first area.

7. An inductor in a radar receiver operative to detect an object through radio frequency (RF) signal is implemented with a tank circuit, the resonating tank circuit comprising:
    a plurality of metal strips forming a first part of a polygon structure enclosing a first area;
    a set of split sections forming a second part and geometrically aligned with the polygon structure, wherein the plurality of metal strips and the set of split sections are formed on one metal layer and the set of split sections and the plurality of metal strips together forming an inductance coil, the set of split sections are geometrically parallel to each other and direction of the current in each of the set of split sections are same; and
    a plurality of capacitors coupled between the split sections to form the tank circuit,
    wherein a first flux linkage due a current flowing in the set of split sections pass through the first area in the same direction as that of a second flux linkage due to the current flowing in the plurality of metal strips.

* * * * *